(12) United States Patent
Chang et al.

(10) Patent No.: US 10,002,966 B1
(45) Date of Patent: Jun. 19, 2018

(54) FIELD EFFECT TRANSISTOR AND DEVICE THEREOF

(71) Applicant: UNITED MICROELECTRONICS CORP., Hsin-Chu (TW)

(72) Inventors: I-Fan Chang, Hsinchu (TW); Chi-Ju Lee, Tainan (TW); Yen-Liang Wu, Taipei (TW); Wen-Tsung Chang, Tainan (TW); Jui-Ming Yang, Taichung (TW); Dien-Yang Lu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/655,919

(22) Filed: Jul. 21, 2017

(30) Foreign Application Priority Data

Jun. 29, 2017 (TW) .............................. 106121736 A

(51) Int. Cl.
*H01L 29/78* (2006.01)
*H01L 29/06* (2006.01)

(52) U.S. Cl.
CPC ...... *H01L 29/7854* (2013.01); *H01L 29/0653* (2013.01)

(58) Field of Classification Search
CPC .................. H01L 29/0653; H01L 29/7854
See application file for complete search history.

(56) References Cited

U.S. PATENT DOCUMENTS

| 7,579,280 | B2 | 8/2009 | Brask | |
|---|---|---|---|---|
| 7,833,887 | B2 | 11/2010 | Rachmady | |
| 9,666,715 | B2 | 5/2017 | Chang | |
| 2004/0217420 | A1* | 11/2004 | Yeo | H01L 21/84 257/347 |
| 2007/0196972 | A1* | 8/2007 | Shima | H01L 21/823807 438/197 |
| 2011/0298053 | A1* | 12/2011 | Zhong | H01L 21/28176 257/368 |
| 2014/0252487 | A1* | 9/2014 | Stephens | H01L 21/28026 257/368 |
| 2016/0163797 | A1* | 6/2016 | Shen | H01L 29/785 257/401 |
| 2016/0233164 | A1* | 8/2016 | Choi | H01L 27/0924 |

* cited by examiner

*Primary Examiner* — Joseph C Nicely
*Assistant Examiner* — Lamont Koo
(74) *Attorney, Agent, or Firm* — Winston Hsu

(57) ABSTRACT

A field-effect transistor includes a substrate having thereon an isolation region. A fin structure protrudes from a top surface of the isolation region. The fin structure extends along a first direction. A gate electrode strides across the fin structure and extends along a second direction. A fin corner layer wraps a lower portion of the gate electrode around the fin structure. A spacer covers a sidewall of the gate electrode and the fin corner layer.

18 Claims, 2 Drawing Sheets

FIELD EFFECT TRANSISTOR AND DEVICE THEREOF

CROSS REFERENCE TO RELATED APPLICATION

This application claims priority from Taiwan Patent Application Ser. No. 106121736 filed Jun. 29, 2017, which is included in its entirety herein by reference.

BACKGROUND OF THE INVENTION

1. Field of the Invention

Embodiments of the present invention relates to the field of semiconductor technology, and in particular to a semiconductor field effect transistor and device.

2. Description of the Prior Art

In advanced semiconductor technology, fin-type field effect transistor (FinFET) has replaced the traditional planar-type transistors, and become a mainstream complementary metal oxide semiconductor (CMOS) technology. Typically, at the beginning of the formation of the FinFET, an isolation trench is formed in the semiconductor substrate by at least a patterning process such as lithography and etching to transfer the pattern to the semiconductor substrate, and a plurality of fin structures are defined by the formation of the isolation trench.

The isolation trenches are then filled with an insulating dielectric material to form an isolation structure between the fins. The insulating dielectric material is then recessed to expose the top and upper sidewalls of the fin structures. Then, a gate structure is formed across the fin structures, wherein the overlapping area between the fin structures and the gate structure is the channel region of the FinFET.

However, the critical device size continues to shrink, resulting in a short channel effect. Due to the reduced size of the MOSFET, the gate of the MOSFET has a small effective length. In the case of applying a specific gate voltage, the charge that the gate can control in the depleted region is reduced. Thus, the MOSFET has a lower threshold voltage.

SUMMARY OF THE INVENTION

It is one object of the present invention to provide an improved semiconductor field effect transistor and device which can solve the above-mentioned disadvantages and shortcomings of the prior art.

According to one aspect of the invention, a field-effect transistor includes a substrate having thereon an isolation region is disclosed. The field-effect transistor comprises a fin structure protruding from a top surface of the isolation region. The fin structure extends along a first direction. A gate electrode strides across the fin structure and extends along a second direction. A fin corner layer wraps a lower portion of the gate electrode around the fin structure. A spacer covers a sidewall of the gate electrode and the fin corner layer.

According to another aspect of the invention, a device comprising a substrate having thereon an isolation region is disclosed. The device comprises four fin structures protruding from a top surface of the isolation region. The four fin structures are in parallel with one another and extend along a first direction. A gate electrode strides across the four fin structures and extending along a second direction. A fin corner layer wraps a lower portion of the gate electrode around each of the four fin structures. A spacer covers a sidewall of the gate electrode and the fin corner layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
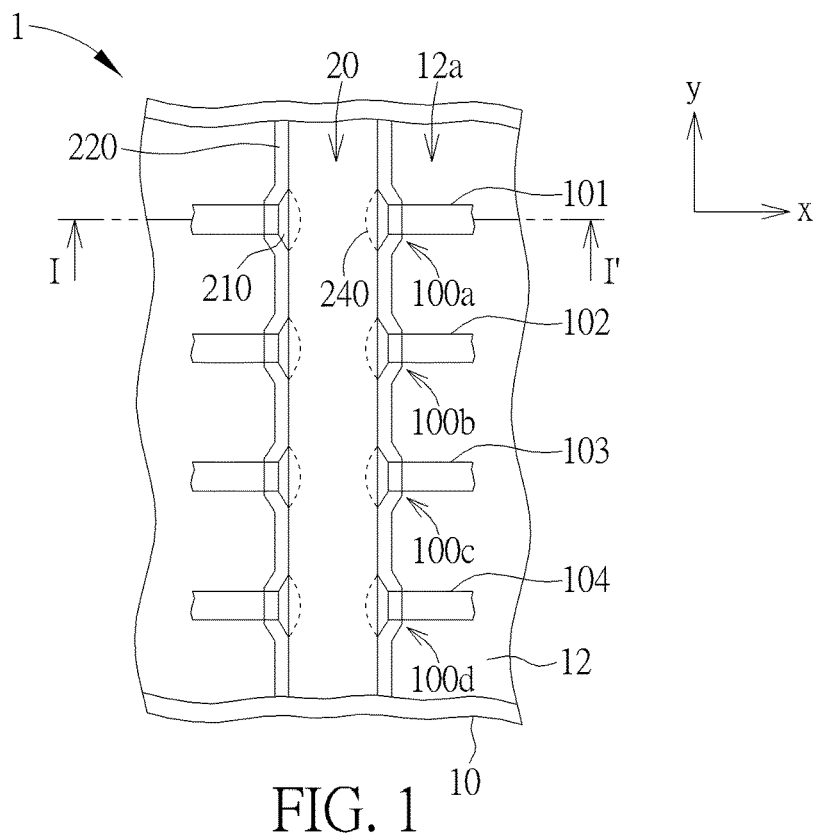
FIG. 1 is a schematic top view showing a portion of a semiconductor device according to one embodiment of the present invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

The term "fin corner" as used herein to mean an inverted or reversed U-shaped region defined at the interface between the fin structure of a fin-type field effect transistor (FinFET) and the lower part of the metal gate of the FinFET.

Figure 2:
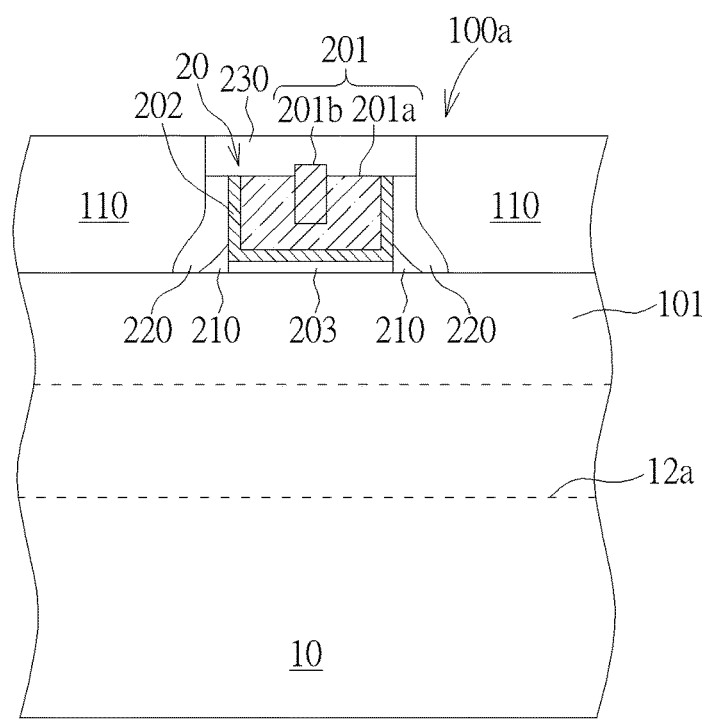
FIG. 2 is a schematic cross-sectional view taken along line I-I' in FIG. 1.

Referring to FIGS. 1 and 2, in which FIG. 1 is a schematic top view showing a portion of a semiconductor device according to one embodiment of the present invention, and FIG. 2 is a schematic cross-sectional view taken along line I-I' in FIG. 1. As shown in FIG. 1 and FIG. 2, the semiconductor device 1 comprises a substrate 10, for example, a semiconductor substrate or a silicon substrate. According to one embodiment of the present invention, the substrate 10 has an isolation region 12, for example, shallow trench isolation (STI) region.

According to one embodiment of the present invention, the semiconductor device 1 comprises four fin structures 101~104 protruding from a top surface 12a of the isolation region 12 in which the fin structures 101~104 are parallel to one another and extend in a first direction, for example, the reference x-axis direction.

According to one embodiment of the present invention, the substrate 10 is a silicon substrate, and the four fin structures 101~104 are silicon fin structures.

According to one embodiment of the present invention, the semiconductor device 1 further comprises a gate electrode 20 striding across the fin structures 101~104 and extending in a second direction, for example, the reference y-axis direction, and sequentially forming four field effects transistors 100a, 100b, 100c, and 100d. According to one embodiment of the present invention, the first direction is perpendicular to the second direction. The cross section in FIG. 2 shows the upper portion of the gate electrode 20 located directly above the fin structure 101.

According to an embodiment of the present invention, the gate electrode 20 is a metal gate. For example, the gate electrode 20 may be formed in a dielectric layer 110 by a replacement metal gate process. The dielectric layer 110 may comprises silicon dioxide or low dielectric constant (low-k) material layer, but is not limited thereto.

According to one embodiment of the present invention, the gate electrode 20 includes a metal layer 201, a gate dielectric layer 202 disposed between the metal layer 201 and each of the fin structures 101~104, and an interfacial layer 203 between the dielectric layer 202 and each of the fin structures 101~104.

According to one embodiment of the present invention, the metal layer 201 may comprise a first metal layer 201a and a second metal layer 201b. The first metal layer 201a may comprise a barrier layer such as titanium nitride or tantalum nitride, and a work function metal layer such as tungsten carbide (WC), titanium aluminum (TiAl), titanium carbide (TiC), tantalum carbide (TaC), etc. The second metal layer 201b may comprise a low resistance metal layer, such as tungsten, but is not limited thereto.

Each of the first metal layer 201a and the second metal layer 201b may be a single layer or a multilayer structure. According to one embodiment of the present invention, the second metal layer 201b may protrude from the top surface of the first metal layer 201a.

According to one embodiment of the present invention, the interfacial layer 203 may be a silicon dioxide layer, but is not limited thereto.

According to one embodiment of the present invention, the gate dielectric layer 202 may be a high dielectric constant (high-k) material such as hafnium oxide ($HfO_2$), aluminum oxide ($Al_2O_3$), lanthanum trioxide ($La_2O_3$), tantalum pentoxide ($Ta_2O_5$), zirconium dioxide ($ZrO_2$), hafnium silicon oxide (HfSiO), hafnium silicon oxynitride (HfSiON), lanthanum aluminate ($LaAlO_3$), zirconium silicate ($ZrSiO_4$), or the like.

According to one embodiment of the present invention, the gate electrode 20 is a recessed gate capped with a capping layer 230, for example, a silicon nitride layer. The top surface of the capping layer 230 is flush with the top surface of the dielectric layer 110.

According to one embodiment of the present invention, the semiconductor device 1 further comprises a fin corner layer 210 wrapping a lower portion of the gate electrode 20 around each of the fin structures 101~104. According to one embodiment of the present invention, the semiconductor device 1 further comprises a spacer 220 covering each sidewall of the gate electrode 20 and the fin corner layer 210.

According to one embodiment of the present invention, the fin corner layer 210 is in direct contact with the gate dielectric layer 202 and the interfacial layer 203. According to one embodiment of the present invention, the spacer 220 is in direct contact with the gate dielectric layer 202 and the fin corner layer 210, while the spacer 220 is not in direct contact with the interfacial layer 203. According to one embodiment of the present invention, the fin corner layer 210 is not in direct contact with the dielectric layer 110.

According to one embodiment of the present invention, the fin corner layer 210 comprises a silicon oxide layer, such as silicon dioxide, but is not limited thereto. According to one embodiment of the present invention, the fin corner layer 210 may be formed by oxidizing the lower portion of the dummy polysilicon gate along the fin corners of each of the fin structure 101 when the dummy polysilicon gate (not shown) is formed by etching.

Figure 3:
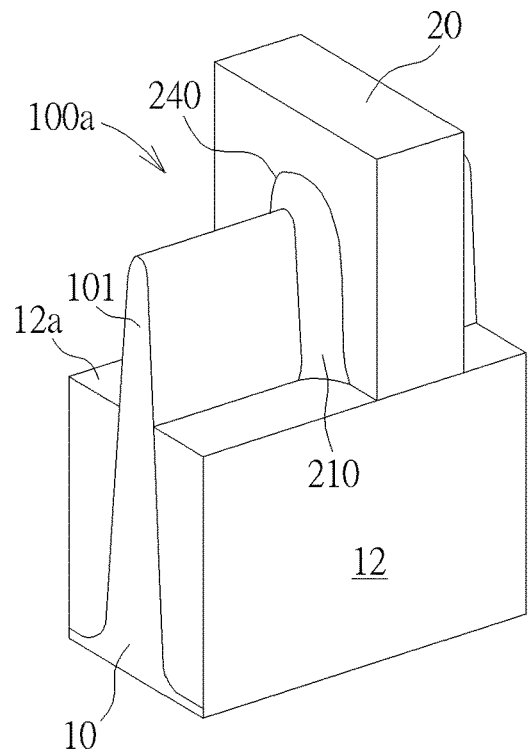
FIG. 3 is a perspective view, showing the relative position of the fin structure, gate electrode and fin corner layer of the semiconductor device according to one embodiment of the invention.
Figure 4:
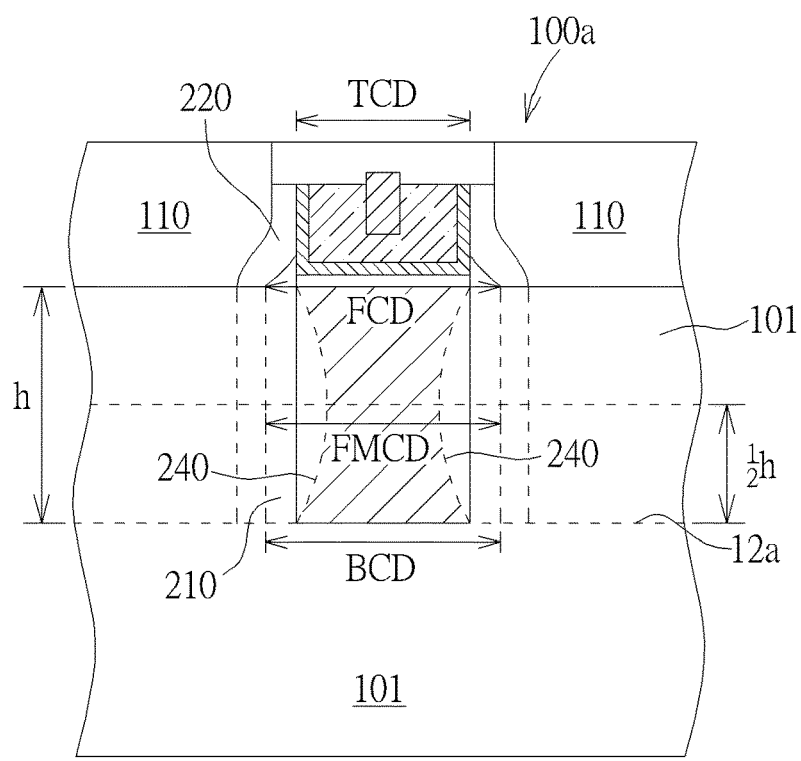
FIG. 4 is a cross-sectional perspective view showing the fin structure of the gate electrode across the fin structure, the inner contour of the gate electrode along the surface of the fin structure, the recessed structure, and the fin corner layer, with dashed lines.

Referring also to FIG. 3 and FIG. 4, in which FIG. 3 is a perspective view showing the relative positions of the fin structure 101, the gate electrode 20, and the fin corner layer 210 (the spacers 220 and the dielectric layer 110 are omitted), and FIG. 4 is a cross-sectional perspective view depicting the inner contour or profile of the gate electrode 20 across the fin structure 101, and the fin corner layer 210.

As can be seen from FIG. 3 and FIG. 4, the lower portion of the gate electrode 20 is provided with a depression or a recessed structure 240 along the corner of the fin structure 101. According to one embodiment of the present invention, the recessed structure 240 exhibits an inverted U-shape along the corner of the fin structure 101. The fin corner layer 210 extends along the corner of the fin structure 101 into the recessed structure 240 in the lower portion of the gate electrode 20.

According to one embodiment of the present invention, the surface of the fin corner layer 210 may have a curvature of the concave curved surface from the lower portion of the gate 20 to the fin structure 101.

As can be seen from FIG. 4, the recessed structure 240 may be formed in the lower portion of the gate electrode 20 downwardly and inwardly from the top of the fin structure 101. The recessed structure 240 may reach its maximum depth at half the height (½h) of the fin structure 101, and the width of the lower portion of the gate electrode 20 here is minimal in the vicinity of the fin structure 101, while the thickness of the fin corner layer 210 here is maximized, so that at the half the height of the fin structure 101, a critical dimension FMCD of the gate electrode 20 is defined for the gate electrode 20 formed with the fin corner layer 210.

A fin top critical dimension FCD is defined for the gate electrode 20 formed with the fin corner layer 210 at the top of the fin structure 101 with height h, whereas at the bottom of the fin structure 101 (i.e., the top surface 12a of the isolation region 12), a fin bottom critical dimension BCD is defined for the gate electrode 20 formed with the fin corner layer 210. At the top of the gate electrode 20 is defined a top critical dimension TCD.

According to one embodiment of the present invention, the critical dimension FMCD, fin top critical dimension FCD and fin bottom critical dimension BCD are approximately equal. The critical dimension FMCD, fin top critical dimension FCD and fin bottom critical dimension BCD are greater than the top critical dimension TCD.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A field-effect transistor, comprising:
    a substrate having thereon an isolation region;

a fin structure protruding from a top surface of the isolation region, wherein the fin structure extends along a first direction, wherein the fin structure has a height h;

a gate electrode striding across the fin structure and extending along a second direction;

a fin corner layer disposed in a recessed structure at a lower portion of the gate electrode around the fin structure, wherein the recessed structure reaches its maximum depth at half the height (½h) of the fin structure, where a width of the lower portion of the gate electrode is minimal in the vicinity of the fin structure, while a thickness of the fin corner layer is maximized at the half the height of the fin structure; and a spacer being in direct contact with a sidewall of the gate electrode and the fin corner layer.

2. The field-effect transistor according to claim 1, wherein the recessed structure has a reversed U-shape around the fin structure.

3. The field-effect transistor according to claim 1, wherein the fin corner layer has a curvature of the concave curved surface from the lower portion of the gate to the fin structure.

4. The field-effect transistor according to claim 1, wherein the gate electrode comprises a metal layer, a gate dielectric layer between the metal layer and the fin structure, and an interfacial layer between the gate dielectric layer and the fin structure.

5. The field-effect transistor according to claim 4, wherein the fin corner layer is in direct contact with the gate dielectric layer and the interfacial layer.

6. The field-effect transistor according to claim 4, wherein the spacer is in direct contact with the gate dielectric layer and the fin corner layer.

7. The field-effect transistor according to claim 6, wherein the spacer is not in direct contact with the interfacial layer.

8. The field-effect transistor according to claim 1, wherein the substrate is a silicon substrate and the fin structure is a silicon fin structure.

9. The field-effect transistor according to claim 1, wherein the fin corner layer comprises silicon oxide.

10. A device, comprising:

a substrate having thereon an isolation region;

four fin structures protruding from a top surface of the isolation region, wherein the four fin structures are in parallel with one another and extend along a first direction, wherein the four fin structures have a height h;

a gate electrode striding across the four fin structures and extending along a second direction;

a fin corner layer disposed in a recessed structure at a lower portion of the gate electrode around each of the four fin structures, wherein the recessed structure reaches its maximum depth at half the height (½h) of the four fin structures, where a width of the lower portion of the gate electrode is minimal in the vicinity of the four fin structures, while a thickness of the fin corner layer is maximized at the half the height of the four fin structures; and a spacer being in direct contact with a sidewall of the gate electrode and the fin corner layer.

11. The device according to claim 10, wherein the recessed structure has a reversed U-shape around each of the four fin structures.

12. The device according to claim 10, wherein the fin corner layer has a curvature of the concave curved surface from the lower portion of the gate to the four fin structures.

13. The device according to claim 10, wherein the gate electrode comprises a metal layer, a gate dielectric layer between the metal layer and each of the four fin structures, and an interfacial layer between the gate dielectric layer and each of the four fin structures.

14. The device according to claim 13, wherein the fin corner layer is in direct contact with the gate dielectric layer and the interfacial layer.

15. The device according to claim 13, wherein the spacer is in direct contact with the gate dielectric layer and the fin corner layer.

16. The device according to claim 15, wherein the spacer is not in direct contact with the interfacial layer.

17. The device according to claim 10, wherein the substrate is a silicon substrate and the four fin structure are silicon fin structures.

18. The device according to claim 10, wherein the fin corner layer comprises silicon oxide.

* * * * *